United States Patent
Amasuga

(10) Patent No.: US 8,063,420 B2
(45) Date of Patent: Nov. 22, 2011

(54) FIELD-EFFECT TRANSISTOR AND METHOD OF MANUFACTURING THE SAME

(75) Inventor: Hirotaka Amasuga, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 156 days.

(21) Appl. No.: 12/512,099

(22) Filed: Jul. 30, 2009

(65) Prior Publication Data

US 2010/0219454 A1 Sep. 2, 2010

(30) Foreign Application Priority Data

Mar. 2, 2009 (JP) ................... 2009-048185

(51) Int. Cl.
*H01L 29/80* (2006.01)
(52) U.S. Cl. .................. 257/280; 257/E29.32; 438/574
(58) Field of Classification Search .................. 257/280, 257/E29.32; 438/574
See application file for complete search history.

(56) References Cited

U.S. PATENT DOCUMENTS

| | | | | |
|---|---|---|---|---|
| 4,871,687 A * | 10/1989 | Donzelli | ........... | 438/570 |
| 4,959,705 A * | 9/1990 | Lemnios et al. | ........... | 257/532 |
| 6,504,190 B2 * | 1/2003 | Haematsu | ........... | 257/283 |
| 6,600,179 B2 * | 7/2003 | Quaglietta et al. | ........... | 257/197 |
| 7,095,114 B2 * | 8/2006 | Takahashi et al. | ........... | 257/728 |
| 7,250,643 B2 * | 7/2007 | Nishi | ........... | 257/194 |
| 7,528,443 B2 * | 5/2009 | Kunii et al. | ........... | 257/340 |
| 7,557,389 B2 | 7/2009 | Amasuga et al. | | |
| 2002/0140007 A1 * | 10/2002 | Sakamoto | ........... | 257/276 |
| 2003/0080349 A1 | 5/2003 | Quaglietta et al. | | |
| 2008/0087916 A1 * | 4/2008 | Amasuga et al. | ........... | 257/194 |

FOREIGN PATENT DOCUMENTS

| | | |
|---|---|---|
| CN | 1495901 A | 5/2004 |
| JP | 11-274175 A | 10/1999 |
| JP | 2008-98400 A | 4/2008 |

OTHER PUBLICATIONS

Amasuga et al., "A High Power Density TaN/Au T-gate pHEMT with High Humidity Resistance for Ka-Band Applications", IEEE MTT-S International Microwave Symposium Digest, pp. 831-834, (2005).

* cited by examiner

*Primary Examiner* — Steven J Fulk
(74) *Attorney, Agent, or Firm* — Leydig, Voit & Mayer Ltd.

(57) ABSTRACT

A field-effect transistor with improved moisture resistance without an increase in gate capacitance, and a method of manufacturing the field-effect transistor are provided. The field-effect transistor includes: a T-shaped gate electrode on a semiconductor layer; and a first highly moisture-resistant protective film including one of an insulating film and an organic film having high etching resistance, the first highly moisture-resistant protective film being located above the T-shaped gate electrode, over all of a region in which the T-shaped gate electrode is located. A cavity is located between the semiconductor layer and the first highly moisture-resistant protective film, below a canopy of the T-shaped gate electrode. An end surface of the cavity is closed by a second highly moisture-resistant film.

11 Claims, 5 Drawing Sheets

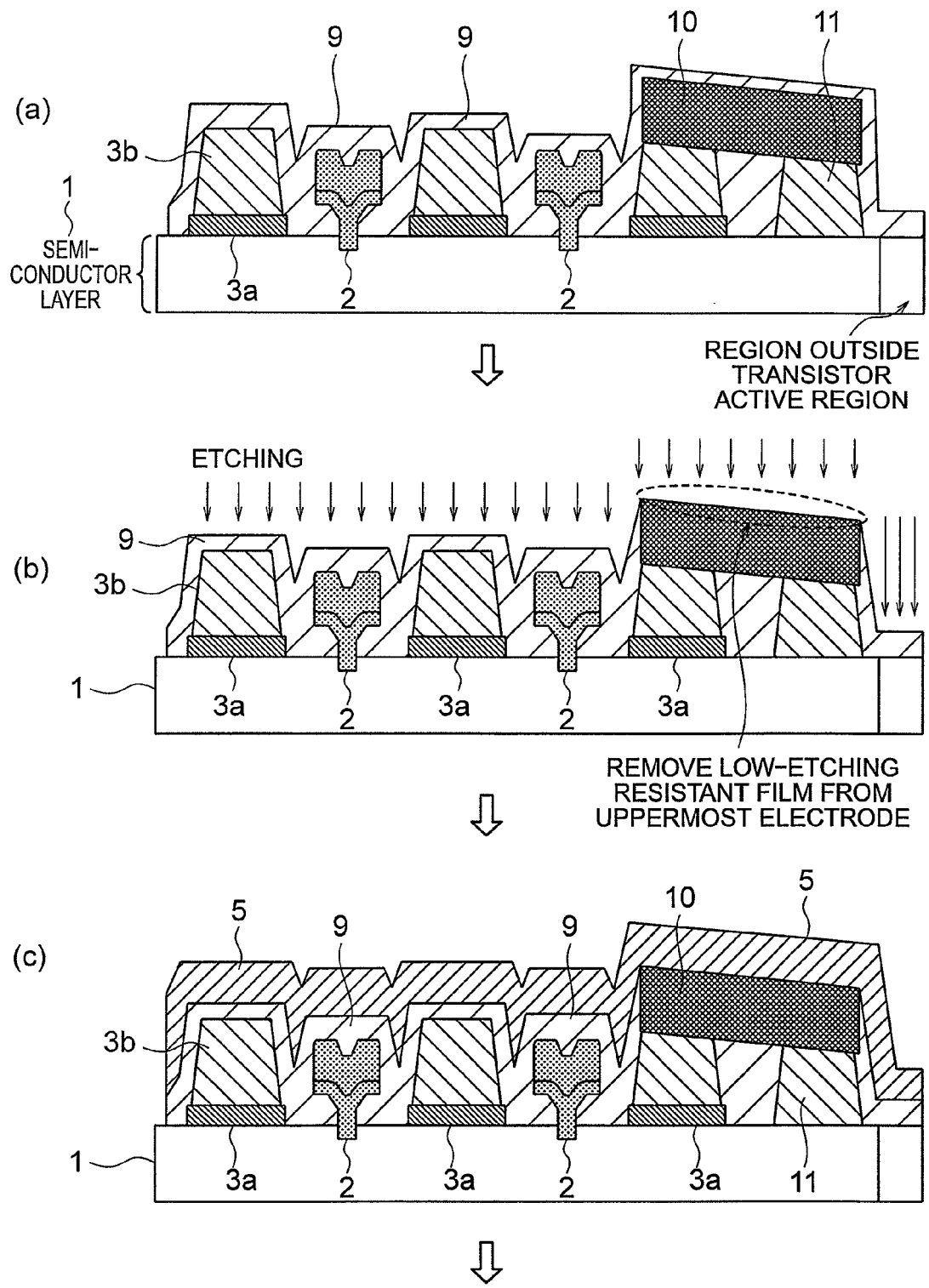

FIELD-EFFECT TRANSISTOR AND METHOD OF MANUFACTURING THE SAME

BACKGROUND OF THE INVENTION

1. Field of the Invention

The present invention relates to a field-effect transistor and a method of manufacturing the field-effect transistor, and more particularly, to a field-effect transistor containing gallium arsenide (GaAs) or gallium nitride (GaN) as a main component, which is suitable for use in a microwave band and a millimeter wave band of several GHz or more, and a method of manufacturing the field-effect transistor.

2. Description of the Related Art

Wireless communication markets using a microwave band and a millimeter wave band are expanding along with the diffusion of satellite communications, high-speed and large-capacity communication systems of a 60 GHz band, on-vehicle radar systems of a 70 to 80 GHz band, and the like. For a transmitting/receiving portion of a signal in those high frequency bands, a field-effect transistor (hereinafter, referred to as FET) such as a metal semiconductor FET (MESFET), a heterostructure FET (HFET), or a high electron mobility transistor (HEMT), which is obtained by lamination on a compound semiconductor epitaxial layer substrate formed of a compound semiconductor, in particular, GaAs or GaN, is mainly used.

In order to achieve cost reduction of transmitting/receiving devices, which is requisite for expanding the wireless communication markets, it is effective to change a hermetically sealed package for a non-hermetically sealed type or a mold sealed type. Meanwhile, a field-effect transistor using the compound semiconductor is generally vulnerable to moisture, and is required to attain high moisture resistance of a chip itself.

In order to enhance moisture resistance, there is an effective measure in which a moisture-resistant protective film is laminated on a surface of a semiconductor to thereby prevent moisture from reaching the surface of the semiconductor. However, in general, the covering by the moisture-resistant protective film accompanies deterioration of transistor characteristics. In a case of the field-effect transistor, an insulating protective film is interposed in a space between a gate electrode and the surface of the semiconductor or between the gate electrode and source and drain electrodes, and therefore a gate capacitance is increased, with the result that the device characteristics are deteriorated.

In general, a FET for a high-power amplifier often adopts a T-shaped gate structure which is effective in reducing a gate resistance. In the T-shaped gate structure, a cavity is formed between a portion below a canopy of the gate and a semiconductor layer. When the cavity below the canopy is filled by lamination of an insulating protective film, the above-mentioned gate capacitance is further increased, and gain characteristics in the micro wave and the millimeter wave are reduced.

An attempt to simultaneously achieve protection of a highly-moisture-resistant film and suppression of an increase in gate capacitance is proposed in JP 2008-98400 A, for example. In the field-effect transistor described in JP 2008-98400 A, the increase in gate capacitance is suppressed by forming the cavity below the canopy of the T-shaped gate.

In JP 2008-98400 A, the increase in gate capacitance is suppressed by forming the cavity below the canopy of the T-shaped gate. However, forming the cavity only below the canopy of the T-shaped gate cannot eliminate a constant increase in gate capacitance due to the highly-moisture-resistant insulating film deposited outside the canopy of the T-shaped gate. As a result, there arises a problem that a gain reduction is caused.

Table 1 below shows results of a gain (MSG) evaluated at 10 GHz in three types of GaAs-pHEMT structures. In a transistor structure with a cavity below a canopy of a gate, the gain is increased by about 0.5 dB compared with a structure in which a portion below the canopy is filled, whereas the gain is decreased by about 0.6 dB to 0.7 dB compared with a transistor without a highly-moisture-resistant film.

TABLE 1

| GaAs-pHEMT structure: Comparison of gain (MSG) at 10 GHz | | |
|---|---|---|
| Structure in which a portion below a canopy is filled with an insulating film | Insulating film protection structure with a cavity below a canopy | Structure without a protective film |
| 14.5 dB | 15.0 dB | 15.65 dB |

SUMMARY OF THE INVENTION

The present invention has been made in order to solve the above-mentioned problem, and an object thereof is to achieve a field-effect transistor capable of improving moisture resistance to a large extent while suppressing an increase in gate capacitance, and a method of manufacturing the field-effect transistor.

The present invention provides a field-effect transistor including: a T-shaped gate electrode formed on a semiconductor layer; and a protective film including one of an insulating film and an organic film having high moisture resistance and high etching resistance, the protective film being formed above the T-shaped gate electrode over an entire transistor active region, which is a region in which the T-shaped gate electrode is formed, in which: a cavity is formed between the semiconductor layer and the protective film in a vicinity of the T-shaped gate electrode, the vicinity including a portion below a canopy of the T-shaped gate electrode; and the cavity is surrounded by a highly-moisture-resistant film at an edge of the transistor active region.

According to the present invention, by providing the field-effect transistor including: the T-shaped gate electrode formed on the semiconductor layer; and the protective film including one of the insulating film and the organic film having high moisture resistance and high etching resistance, the protective film being formed above the T-shaped gate electrode over the entire transistor active region, which is the region in which the T-shaped gate electrode is formed, in which: the cavity is formed between the semiconductor layer and the protective film in the vicinity of the T-shaped gate electrode, the vicinity including the portion below the canopy of the T-shaped gate electrode; and an end surface of the cavity open to an outside is closed by the highly-moisture-resistant film, the moisture resistance can be improved to a large extent while suppressing the increase in gate capacitance.

BRIEF DESCRIPTION OF THE DRAWINGS

In the accompanying drawings:

FIGS. 4A to 4B are explanatory views illustrating a flow of a method of manufacturing the field-effect transistor according to the first embodiment of the present invention.

DETAILED DESCRIPTION OF THE PREFERRED EMBODIMENT

Embodiment 1

Hereinafter, an embodiment of a field-effect transistor and a method of manufacturing the field-effect transistor according to the present invention is described. The field-effect transistor according to the present invention enables large improvement of moisture resistance while suppressing of an increase in gate capacitance, by forming a cavity on a surface of a semiconductor (or on a protective insulating film deposited on the surface) around a gate and in the vicinity thereof including a portion below a canopy of the gate, and by arranging a highly-moisture-resistant protective film thereon.

Figure 1:
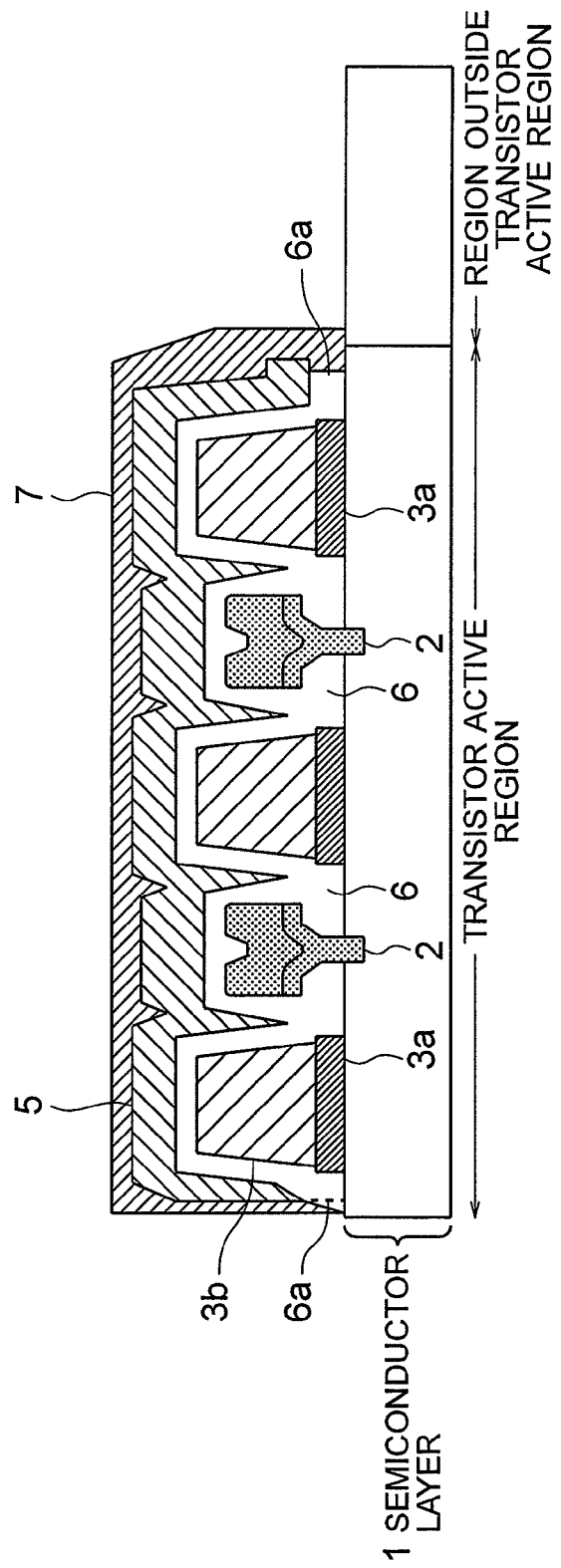
FIG. 1 is a sectional view illustrating a structure of a field-effect transistor according to a first embodiment of the present invention.

FIG. 1 illustrates a structure of a field-effect transistor according to a first embodiment of the present invention. In the field-effect transistor according to the first embodiment of the present invention, as illustrated in FIG. 1, a T-shaped gate electrode 2 and a source or drain (hereinafter, referred to as SD) electrode 3 are formed on a predetermined region defined on a semiconductor layer 1. Note that the SD electrode 3 includes an SD electrode (contact layer) 3a formed on the semiconductor layer 1, and an SD electrode (vapor-deposited layer or plating layer) 3b formed on the SD electrode 3a. Hereinafter, those SD electrodes 3a and 3b are collectively called an SD electrode 3. The semiconductor layer 1 includes a buffer layer, a channel layer, a gate contact layer, a gate embedding layer, a capping layer, and the like. As illustrated in FIG. 1, the T-shaped gate electrodes 2 and the SD electrodes 3 are alternately arranged on the semiconductor layer 1. Note that the above-mentioned predetermined region on which the T-shaped gate electrodes 2 and the SD electrodes 3 are formed is referred to as a transistor active region. Further, the region other than the transistor active region is referred to as a region outside the transistor active region. Note that the example of FIG. 1 illustrates the T-shaped gate electrode 2 as a gate electrode, but a gate electrode is not limited to the T shape and may have an eaves shape. Accordingly, a gate electrode may be, for example, Y-shaped or T-shaped.

Further, as illustrated in FIG. 1, a first highly-moisture-resistant protective film 5 is formed so as to cover the entire transistor active region. The first highly-moisture-resistant protective film 5 is a protective film including an insulating film or an organic film having high moisture resistance and high etching resistance. Further, in the vicinity of the T-shaped gate electrode 2, which includes a portion below a canopy of the T-shaped gate electrode 2, a cavity 6 is present between the first highly-moisture-resistant protective film 5 and a surface of the semiconductor layer 1. In addition, also in the vicinity of the SD electrode 3, a cavity 6 is present between the first highly-moisture-resistant protective film 5 and the surface of the semiconductor layer 1. Accordingly, the first highly-moisture-resistant protective film 5 is hollow. Moreover, in FIG. 1, a second highly-moisture-resistant protective film 7 is formed on the first highly-moisture-resistant protective film 5.

As illustrated in FIG. 1, the first highly-moisture-resistant protective film 5 is not brought into contact with the surface of the semiconductor layer 1 because the cavity 6 is present. Accordingly, an end surface 6a at which the cavity 6 contacts with the outside exists below the first highly-moisture-resistant protective film 5 in the vicinity of the boundary between the transistor active region and the region outside the transistor active region. The end surface 6a is a hole, and therefore moisture of the outside may infiltrate therefrom. For that reason, the second highly-moisture-resistant protective film 7 serves as a protective film for preventing infiltration of moisture thereinto. In FIG. 1, the second highly-moisture-resistant protective film 7 covers the entire transistor active region in addition to the end surface 6a of the cavity 6, but the second highly-moisture-resistant protective film 7 may be present only in the end surface portion of the cavity 6. Further, the first highly-moisture-resistant protective film 5 and the second highly-moisture-resistant protective film 7 may be formed of the same material, or different materials.

Figure 2:
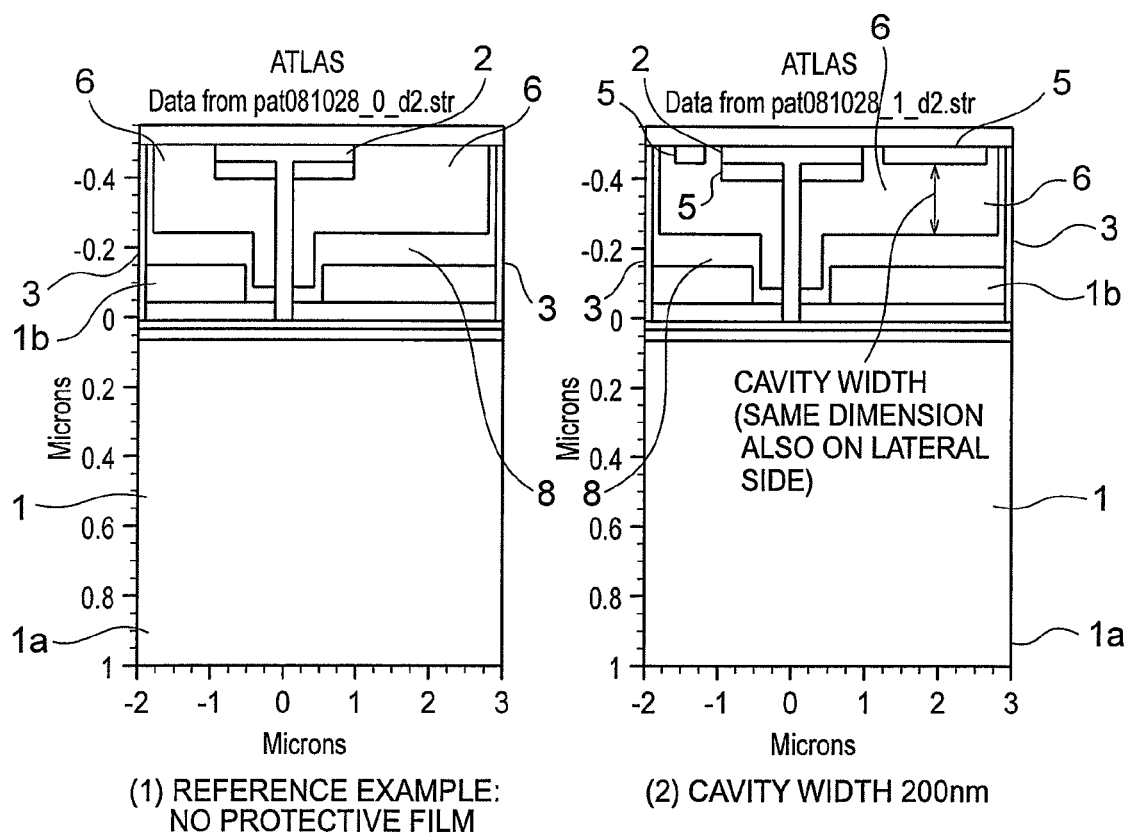
FIG. 2 is an explanatory view illustrating results obtained by analyzing a cavity width suitable in terms of a gate capacitance by device simulation, in the field-effect transistor according to the first embodiment of the present invention and in a reference example.
Figure 3:
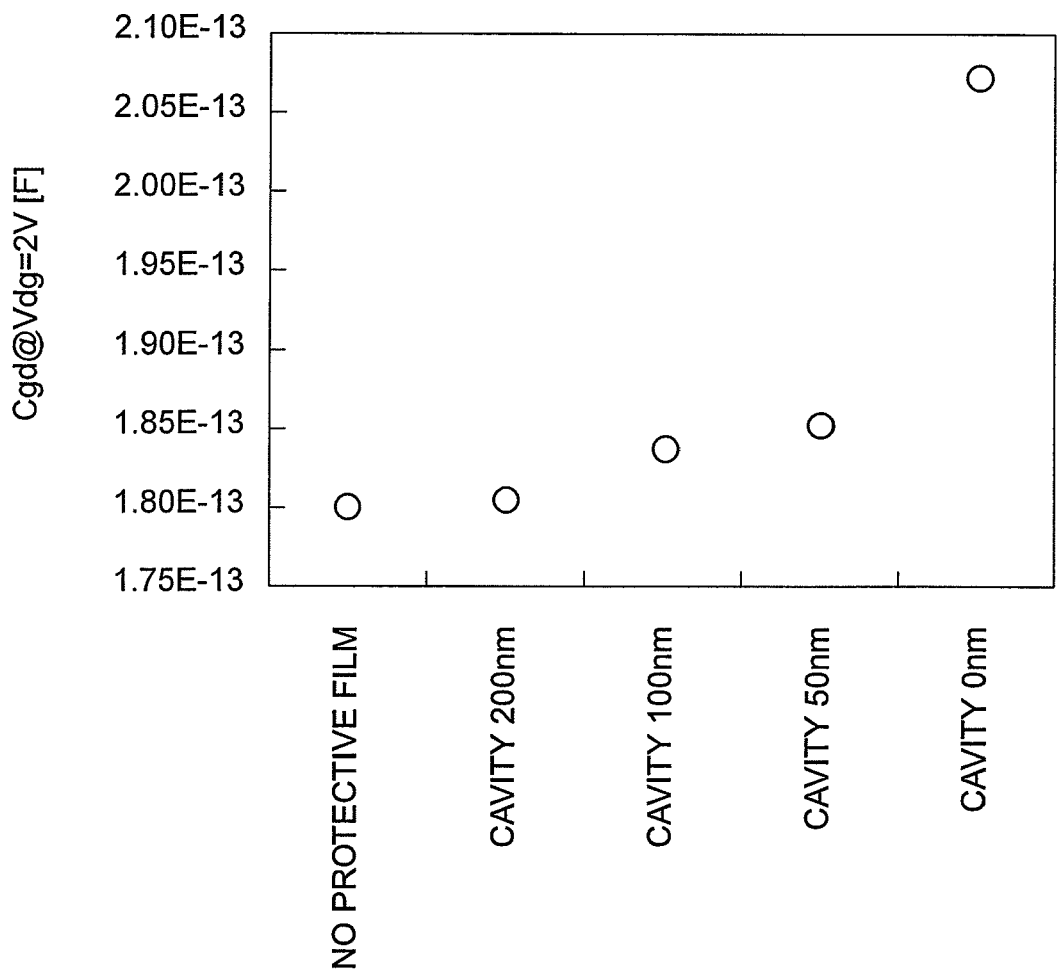
FIG. 3 is an explanatory graph illustrating results obtained by analyzing the cavity width suitable in terms of the gate capacitance by the device simulation, in the field-effect transistor according to the first embodiment of the present invention and in the reference example.

FIGS. 2 and 3 illustrate results obtained by analyzing a cavity width (thickness of the cavity 6) suitable for the cavity 6 in terms of a gate capacitance by device simulation. FIG. 2 illustrates a cross section in the surroundings of the gate of a model transistor. In FIG. 2, the T-shaped gate electrode 2 has a stem whose lower part is embedded in the semiconductor layer 1, and a recess extending from the gate electrode toward both a source side and a drain side is formed on the semiconductor layer 1. In FIG. 2A, the semiconductor layer 1 includes an AlGaAs layer 1a and a GaAs layer 1b formed on the AlGaAs layer 1a. In a structure of a reference example of (1) in FIG. 2, only a surface protective insulating film 8 ($Si_3N_4$: 50 nm thick) is present, whereas in a structure of (2) in FIG. 2 according to this embodiment, the first highly-moisture-resistant protective film 5 made of an insulating film ($Si_3N_4$) is arranged between the T-shaped gate electrode 2 and the SD electrode 3 together with the cavity 6 having a cavity width of 200 nm (cavity widths on the surface side and both the electrode sides are 200 nm, though viewed in a different way because of different scales for the longitudinal axis and the lateral axis of the cross section).

In those structures, a gate-drain capacitance (Cgd) obtained when a voltage is applied to only the right-hand SD electrode 3 (drain side) and then a potential difference between the SD electrode 3 and the T-shaped gate electrode 2 is set to Vdg=2V is derived by simulation analysis using a finite element method. FIG. 3 illustrates values derived by changing the cavity width from 0 to 200 nm. It is found that an increase ratio of Cgd is within 3% when the cavity width ranges from 50 nm to 200 nm, and the increase ratio is over 15% when the cavity width is 0 nm. Accordingly, the cavity width is desired to be equal to or larger than 50 nm. On the other hand, when the cavity width is large, the first highly-moisture-resistant protective film 5 and the like are easily deformed, which is not desirable. In FIG. 3, the increase ratio of Cgd is under 0.25% when the cavity width is 200 nm, which is a value substantially ignorable. As a result, an appropriate cavity width is about 50 to 200 nm.

For the first highly-moisture-resistant protective film 5 and the second highly-moisture-resistant protective film 7, a silicon nitride film (hereinafter, referred to as $SiN_x$), which has high moisture resistance and high etching resistance, is most suitable. Examples of insulating protective films which are generally used in many cases include a silicon oxide film (SiO) and a silicon oxide nitride film (SiON), which have a smaller refractive index than that of the $SiN_x$ film and are inferior in moisture resistance and hydrofluoric-acid resistance. An organic film also has a drawback in moisture resistance compared with the insulating film.

As to an anisotropic deposition method, a lamination of an SiN film by catalytic chemical vapor deposition (CVD) is used as a realizable method. In the catalytic CVD, a high-temperature tungsten wire disposed above a wafer acts as a catalyst for a reaction of silane ($SiH_4$) and ammonia ($NH_3$), and the $SiN_x$ film can be formed without heating the wafer and without using plasma. Plasma is not generated, and thus the surface of a semiconductor layer is not damaged. Further, the formed $SiN_x$ film becomes an insulating film having a refractive index (refractive index "n" equal to or smaller than 2.05), which is substantially equal to a refractive index of a stoichiometric $Si_3N_4$ film, and also has high moisture resistance and high chemical resistance (against diluted fluoric acid). Those characteristics are described in detail in, for example, "Highly moisture-resistive silicon nitride films prepared by catalytic chemical vapor deposition and application to gallium arsenide field-effect transistors", A. Masuda et. al., Vacuum, Vol. 74, 2004, pp. 525-529. In addition, in the catalytic CVD, reaction products are not generated by surface diffusion, but generated by the tungsten wire. Accordingly, $SiN_x$ does not diffuse much on the surface and is not deposited much on a region which becomes a shaded area, such as a side wall or a portion below a canopy.

Figure 4B:
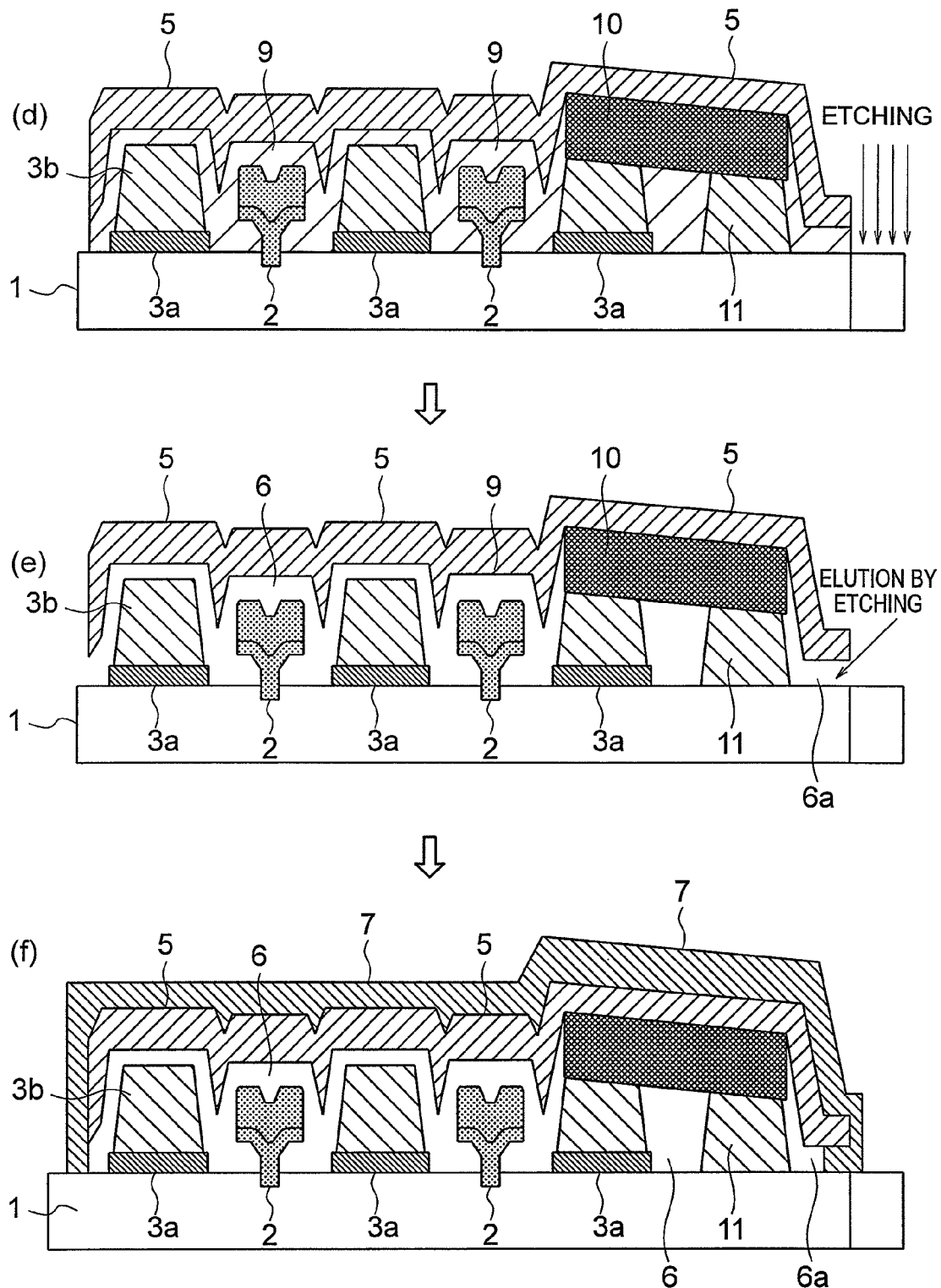

FIGS. 4A to 4B illustrate a process flow of a manufacturing method for the field-effect transistor according to the first embodiment of the present invention. Note that FIGS. 4A to 4B are different from FIG. 1 in that FIGS. 4A to 4B illustrate in more detail a case where wiring electrodes 10 and 11 are formed. The wiring electrode 10 is assumed to be a plating layer such as wiring, and the wiring electrode 11 is assumed to be a vapor-deposited layer or a plating layer. First, as illustrated in FIG. 4A (a), a low-etching resistant film 9 is laminated around and on the T-shaped gate electrode 2 and the SD electrode 3, and on the entire chip including the surface of the semiconductor layer 1 (alternatively, on the surface protective insulating film in a case where the surface protective insulating film exists on the surface of the semiconductor layer 1 in the vicinity of the gate metal). In this case, the low-etching resistant film 9 is laminated not only on the transistor active region but also on the region outside the transistor active region. A thickness of the low-etching resistant film 9 corresponds to the above-mentioned cavity width of the cavity 6, and is assumed to be about 0.5 to 2 μm in this embodiment, for example. Next, as illustrated in FIG. 4A (b), the low-etching resistant film 9 is removed from the upper surface of the wiring electrode 10 which is serving as the uppermost layer by using a planarization process such as general etching or chemical mechanical polishing (CMP). The uppermost wiring electrode 10 is assumed to be a plating layer such as wiring as described above. In this case, the planarization process is optimized so that the low-etching resistant film 9 around the gate remains. Then, as illustrated in FIG. 4A (c), the first highly-moisture-resistant protective film 5 is laminated on the low-etching resistant film 9. A thickness of the first highly-moisture-resistant protective film 5 may be preferably equal to or larger than 50 nm as long as the film is an $SiN_x$ film to which the catalytic CVD is applied. Note that, in the step illustrated in FIG. 4A (b), the low-etching resistant film 9 is removed only from the uppermost wiring electrode 10 in this case. Accordingly, only in this portion, the first highly-moisture-resistant protective film 5 is formed directly on the uppermost wiring electrode 10.

Subsequently, as illustrated in FIG. 4B (d), the first highly-moisture-resistant protective film 5 and the low-etching resistant film 9 are removed from the region outside the transistor active region by etching with the use of a resist mask. The etching in this step may be dry etching or wet etching.

Then, as illustrated in FIG. 4B (e), the low-etching resistant film 9 under the first highly-moisture-resistant protective film 5 is removed from the transistor active region by wet etching, to thereby form a cavity 6. The etching in this step may vary depending on characteristics of the low-etching resistant film 9. For example, in a case where a film such as a resist which can be easily removed by a developing solution is used as the low-etching resistant film 9, the wet etching step is preformed by causing the developing solution to infiltrate between the first highly-moisture-resistant protective film 5 and the semiconductor layer 1. Further, in a case where a film having plasticity such as an elastomer or polyphenyl ether (PPE), which is fused to flow out by the temperature rise, is used as the low-etching resistant film 9, the wet etching step is performed by heating at least a portion between the first highly-moisture-resistant protective film 5 and the semiconductor layer 1 to elute the low-etching resistant film 9. Through the process step, there are generated many cavities. However, the first highly-moisture-resistant protective film 5 is directly attached to the uppermost wiring electrode 10, and the wiring electrode 10 supports the entire first highly-moisture-resistant protective film 5 at this contact surface.

Finally, as illustrated in FIG. 4B (f), the end surface 6a at which the cavity 6 formed in the step illustrated in FIG. 4B (e) is brought into contact with the outside is closed by lamination of the second highly-moisture-resistant protective film 7. A thickness of the second highly-moisture-resistant protective film 7 in a horizontal direction is similar to that of the first highly-moisture-resistant protective film 5. However, in a case of the $SiN_x$ film formed by using the catalytic CVD, a lamination thickness with respect to a vertical surface is markedly thinned compared with a horizontal surface. Conversely, in a case where the lamination thickness with respect to the vertical surface is 50 nm, the thickness with respect to the horizontal surface is equal to or larger than 100 nm. Note that the second highly-moisture-resistant protective film 7 is a protective film for preventing infiltration of moisture by covering the end surface 6a of the cavity 6, and therefore the second highly-moisture-resistant protective film 7 only needs to exist at the end surface 6a of the cavity 6. However, as illustrated in FIG. 4B (f), the second highly-moisture-resistant protective film 7 may be provided so as to cover the entire transistor active region including the end surface 6a of the cavity 6.

As described above, in the first embodiment of the present invention, a film which is easily etched (low-etching resistant film 9) is first applied, and a film which has high moisture resistance and high etching resistance (first highly-moisture-resistant protective film 5) is laminated thereon. After that, the film which is easily etched (low-etching resistant film 9) is removed. As a result, the cavities 6 can be formed easily around the T-shaped gate electrodes 2 and the SD electrodes 3.

As described above, in the present invention, the first highly-moisture-resistant protective film 5 having high moisture resistance and high etching resistance is provided so as to cover the entire transistor active region. The cavities 6 are formed in the portion below the canopy of the T-shaped gate electrodes 2, around the T-shaped gate electrodes 2, around the SD electrodes 3, and in the vicinity of the T-shaped gate electrodes 2. Further, a region in which the first highly-moisture-resistant protective film 5 is removed is formed in the region outside the transistor active region in which the T-shaped gate electrode 2 is not provided. Further, the second highly-moisture-resistant protective film 7 is provided so as to close the end surface 6a between the cavity 6 and the outside. With the cavity 6 thus formed, the first highly-moisture-resistant protective film 5 for protecting the T-shaped gate electrode 2 is not provided in the potion below the canopy of the T-shaped gate electrode 2, whereby the increase in gate capacitance can be suppressed. Further, the first highly-moisture-resistant protective film 5 is formed on the entire transistor active region, whereby the T-shaped gate electrode 2 and the SD electrodes 3 can be protected and prevented from being damaged. In addition, the film having high moisture resistance is used as the first highly-moisture-resistant protective film 5, whereby the moisture resistance can be improved to a large extent. Further, the end surface 6a at which the cavity is originally supposed to contact with the outside is closed by depositing the second highly-moisture-resistant protective film 7, whereby the moisture resistance is more improved.

Note that, in the above-mentioned description, the example in which the film including an insulating film having high moisture resistance and high etching resistance is used as the first highly-moisture-resistant protective film 5 has been described. However, a film including an organic film having high moisture resistance and high etching resistance may be used as the first highly-moisture-resistant protective film 5.

What is claimed is:

1. A field-effect transistor comprising:
    a semiconductor layer including an active region;
    an eaves-shaped gate electrode located on a part of the active region of the semiconductor layer;
    an electrically insulating protective film having high moisture resistance and high etching resistance, the protective film being located above the eaves-shaped gate electrode, with respect to the semiconductor layer, and extending over all of the active region;
    a cavity located between the semiconductor layer and the protective film and proximate the eaves-shaped gate electrode, the cavity including a region below a canopy of the eaves-shaped gate electrode, between the canopy and the active region of the semiconductor layer; and
    a highly moisture-resistant electrically insulating film surrounding the cavity at an edge of the active region.

2. The field-effect transistor according to claim 1, wherein at least one of the protective film and the highly moisture-resistant film is $SiN_x$.

3. The field-effect transistor according to claim 1, wherein the eaves-shaped gate electrode is one of a T-shaped gate electrode, a Y-shaped gate electrode, and a Γ-shaped gate electrode.

4. A method of manufacturing a field-effect transistor, comprising:
    forming an eaves-shaped gate electrode on a semiconductor layer in an active region of the semiconductor layer;
    forming source and drain electrodes on the semiconductor layer in the active region;
    forming a covering film, covering, contacting, and surrounding the eaves-shaped gate electrode, the source electrode, and the gate electrode, and on the semiconductor layer;
    forming a first electrically insulating protective film on the covering film,
    removing the first electrically insulating protective film and the covering film from the semiconductor layer in a region outside the active region of the semiconductor layer so that the first electrically insulating protective film does not contact the semiconductor layer;
    removing the covering film from the active region by wet etching to form a cavity defined by and between the semiconductor layer in the active region and the first electrically insulating protective film, with the first electrically insulating protective film spaced from, covering, and at least partially surrounding the eaves-shaped gate electrode, the source electrode, and the drain electrode; and
    forming a second electrically insulating protective film covering the first electrically insulating protective film, contacting the semiconductor layer, and closing the cavity.

5. The method of manufacturing a field-effect transistor according to claim 4, including removing the covering film from the cavity in the active region by wet etching including infiltrating a developing solution between the semiconductor layer and the first electrically insulating protective film.

6. The method of manufacturing a field-effect transistor according to claim 4, wherein the covering film is a plastic film, including, in removing the covering film by wet etching, increasing the temperature of the covering film and fusing the covering film so that the covering film can flow, by wet etching and eluting the covering film from between the semiconductor layer and the first electrically insulating protective film.

7. A field effect transistor comprising:
    a semiconductor layer having an active region;
    a gate electrode disposed on the semiconductor layer in the active region, the gate electrode including a leg contacting the semiconductor layer and a head on the leg, the head being wider than the leg and spaced from the semiconductor layer so that the head defines a canopy overhanging and covering the leg;
    a source electrode and a drain electrode disposed on the semiconductor layer in the active region;
    a first electrically insulating protective film covering and spaced from the source electrode, the gate electrode, and the drain electrode, and from the semiconductor layer, the first electrically insulating protective layer defining, with the semiconductor layer, a cavity in which the source electrode, the gate electrode, and the drain electrode are located, the first electrically insulating protective film including portions extending toward the semiconductor layer between the source electrode and the gate electrode, and between the gate electrode and the drain electrode, thereby at least partially surrounding each of the source electrode, the gate electrode, and the drain electrode, the first electrically insulating protecting film not extending toward the semiconductor layer beyond the canopy of the gate electrode; and
    a second electrically insulating protective film covering the first electrically insulating protective film, extending to the semiconductor layer, and closing the cavity.

8. The field effect transistor according to claim 7, wherein at least one of the first and second protective films is $SiN_x$.

9. The field effect transistor according to claim 7, wherein the gate electrode has, in a cross section transverse to the semiconductor layer, one of a T-shape, a Y-shape, and a Γ-shape.

10. The field effect transistor according to claim 7, wherein the first electrically insulating protective film is an inorganic film.

11. The field effect transistor according to claim 7, wherein the first electrically insulating protective film is an organic film.

* * * * *